(12) United States Patent
Zhou et al.

(10) Patent No.: US 8,993,896 B2
(45) Date of Patent: Mar. 31, 2015

(54) LEAD ELECTRODE AND PREPARATION METHOD THEREOF

(71) Applicant: Nanchang O-Film Tech. Co., Ltd., Jiangxi (CN)

(72) Inventors: Fei Zhou, Jiangxi (CN); Yulong Gao, Jiangxi (CN); Miaoqian Cao, Jiangxi (CN); Hongwei Kang, Jiangxu (CN)

(73) Assignee: Nanchang O-Film Tech Co., Ltd., Jiangxi (CN)

( * ) Notice: Subject to any disclaimer, the term of this patent is extended or adjusted under 35 U.S.C. 154(b) by 23 days.

(21) Appl. No.: 13/985,623

(22) PCT Filed: Jul. 5, 2013

(86) PCT No.: PCT/CN2013/078934
§ 371 (c)(1),
(2) Date: Aug. 15, 2013

(87) PCT Pub. No.: WO2014/117478
PCT Pub. Date: Aug. 7, 2014

(65) Prior Publication Data
US 2014/0216786 A1    Aug. 7, 2014

(51) Int. Cl.
*H05K 1/09* (2006.01)
*H05K 1/00* (2006.01)
*H05K 1/11* (2006.01)
*H05K 1/02* (2006.01)

(52) U.S. Cl.
CPC .................................. *H05K 1/0296* (2013.01)
USPC ............ 174/257; 174/250; 174/261; 174/262

(58) Field of Classification Search
USPC .......... 174/250, 257, 261, 262; 345/173, 174; 349/12
See application file for complete search history.

(56) References Cited

U.S. PATENT DOCUMENTS

| | | | |
|---|---|---|---|
| 2011/0061908 A1* | 3/2011 | Goto et al. | 174/257 |
| 2013/0092418 A1* | 4/2013 | Shih et al. | 174/250 |
| 2013/0108777 A1* | 5/2013 | Koo et al. | 427/66 |
| 2013/0249863 A1* | 9/2013 | Misaki | 345/174 |
| 2014/0220366 A1* | 8/2014 | Wang et al. | 428/457 |

* cited by examiner

*Primary Examiner* — Timothy Thompson
*Assistant Examiner* — Sherman Ng
(74) *Attorney, Agent, or Firm* — Rosenberg, Klein & Lee

(57) ABSTRACT

A lead electrode and a preparation method thereof are provided. The lead electrode includes an inner terminal, a lead, and an outer terminal, which are sequentially connected. The lead includes: an insulating substrate; an adhesive material coated on the insulating substrate, the adhesive material defining a trenched mesh; and a conductive material filled in the trenched mesh, wherein an angle formed by a grid line of the trenched mesh and a demolding direction is from 0° to 90°. Since the angle formed by the grid line and the demolding direction is very small, little adhesive material will be attached to the mold, such that the residues of the adhesive material are prevented.

8 Claims, 9 Drawing Sheets

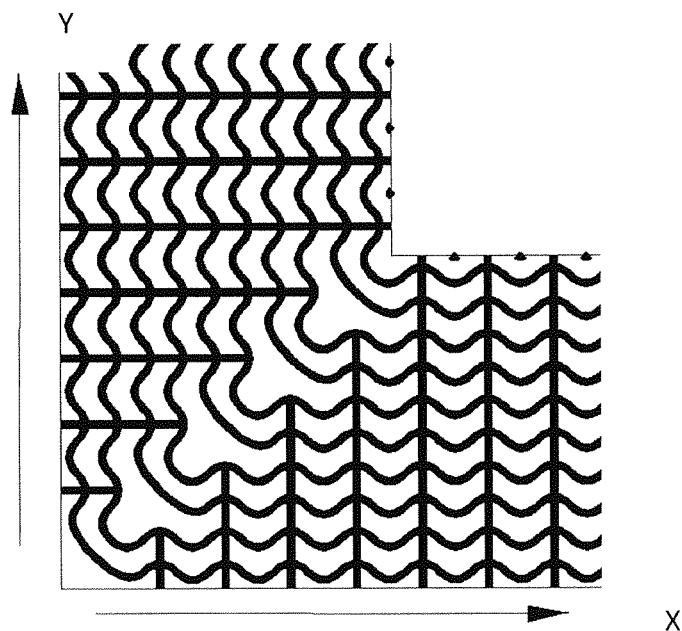
FIG. 9
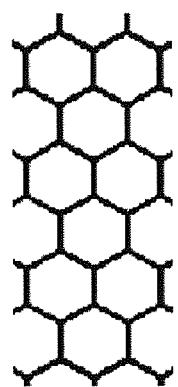 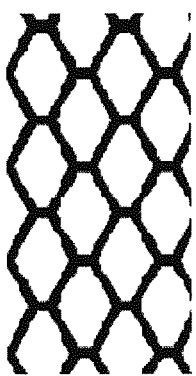
FIG. 10A   FIG. 10B

LEAD ELECTRODE AND PREPARATION METHOD THEREOF

FIELD OF THE INVENTION

The present invention relates to a lead electrode and a preparation method thereof.

BACKGROUND OF THE INVENTION

As a new way of information input device, capacitive touch screens have been widely used in all kinds of information products, such as touch screen phones, GPS navigation systems, and the like.

The conventional capacitive touch screen mainly includes a substrate, an ITO transparent conductive film deposited on the substrate, a metal lead electrode layer deposited on the substrate, a silicon dioxide film covering the ITO transparent electrode and the metal lead electrode layer, and a transparent resin film covering the silicon dioxide film. The ITO transparent electrode forms a capacitive sensor, the metal lead electrode layer connects the ITO transparent electrode along the X direction to a flexible circuit board, the end of ITO electrode connects ITO transparent electrode along the Y direction to the flexible circuit board; the silicon dioxide film and the resin film are used to enhance the reliability and durability of the touch screen device.

A production process of the lead electrode conductive film includes firstly coating a UV adhesive or imprint adhesive on a substrate, then attaching a mold to the substrate, curing and demolding. However, during demolding of the mold from the adhesive, a few adhesive material remains on the mold, which will affect the use of mold, or even cause the production process to stop. In addition, an area of the mesh cell of the conventional conductive lead is relatively small, which will further cause the difficulty of demolding of the mold and the adhesive.

SUMMARY OF THE INVENTION

It is an object of the present invention to provide a lead electrode and a preparation method thereof are provided which can prevent the residues of the adhesive material.

A lead electrode includes an inner terminal, a lead, and an outer terminal, which are sequentially connected. The lead includes: an insulating substrate; an adhesive material coated on the insulating substrate, the adhesive material defines a trenched mesh; and a conductive material filled in the trenched mesh; wherein an angle formed by a grid line of the trenched mesh and a demolding direction is from 0° to 90°.

In one embodiment, the angle formed by the grid line of the trenched mesh and the demolding direction is 45°.

In one embodiment, the trenched mesh is formed by closely arranging a plurality of rectangular mesh cells with the same size.

In one embodiment, two long sides of two adjacent rectangular mesh cells are perpendicular to each other.

In one embodiment, each rectangular mesh cell comprises two long sides and two short sides which are sequentially connected, and the length of the short side is half of the length of the long side.

In one embodiment, the trenched mesh is formed by closely arranging a plurality of quadrilateral mesh cells, each quadrilateral mesh cell comprises two straight lines and two wavy lines connecting two ends of the two straight lines.

In one embodiment, the trenched mesh is formed by closely arranging a plurality of hexagonal or flat hexagonal mesh cells with the same size.

In one embodiment, the inner terminal and the outer terminal are trenched meshes.

A method of preparing a lead electrode includes the following steps:

coating an adhesive material on an insulating substrate;

attaching a mold having a mesh to the adhesive material, and curing the adhesive material;

demolding the mold along a horizontal X-axis direction or a horizontal Y-axis direction which is perpendicular to the horizontal X-axis direction, and forming a trenched mesh on the adhesive material, wherein an angle formed by a grid line of the trenched mesh and the horizontal X-axis direction is from 0° to 90°;

filling a conductive material into the trenched mesh to form a lead; and connecting two ends of the lead to an inner terminal and an outer terminal, respectively, and forming the lead electrode.

In one embodiment, the angle formed by the grid line of the trenched mesh and the horizontal X-axis direction is 45°.

In one embodiment, the trenched mesh is formed by closely arranging a plurality of rectangular mesh cells with the same size.

In one embodiment, two long sides of two adjacent rectangular mesh cells are perpendicular to each other.

In one embodiment, each rectangular mesh cells comprises two long sides and two short sides which are sequentially connected, and the length of the short side is half of the length of the long side.

In one embodiment, the trenched mesh is formed by closely arranging a plurality of quadrilateral mesh cells, each quadrilateral mesh cell comprises two straight lines and two wavy lines connecting two ends of the two straight lines.

In one embodiment, the trenched mesh is formed by closely arranging a plurality of hexagonal or flat hexagonal mesh cells with the same size.

In one embodiment, the inner terminal and the outer terminal are trenched meshes.

In the described preparation method, the angle formed by a grid line of the trenched mesh and the demolding direction is from 0° to 90°. Since the angle formed by the grid line and the demolding direction is very small, little adhesive material will be attached to the mold, such that the residues of the adhesive material are prevented.

BRIEF DESCRIPTION OF THE DRAWINGS

FIG. 9 is a schematic view showing a demolding direction of the lead of FIG. 8;

FIG. 10A is a schematic view of the lead according to a fourth embodiment;

FIG. 10B is a schematic view of the lead according to a fifth embodiment; and

DETAILED DESCRIPTION OF THE EMBODIMENTS

The invention will be described in further detail below in conjunction with the drawings. Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Figure 1:
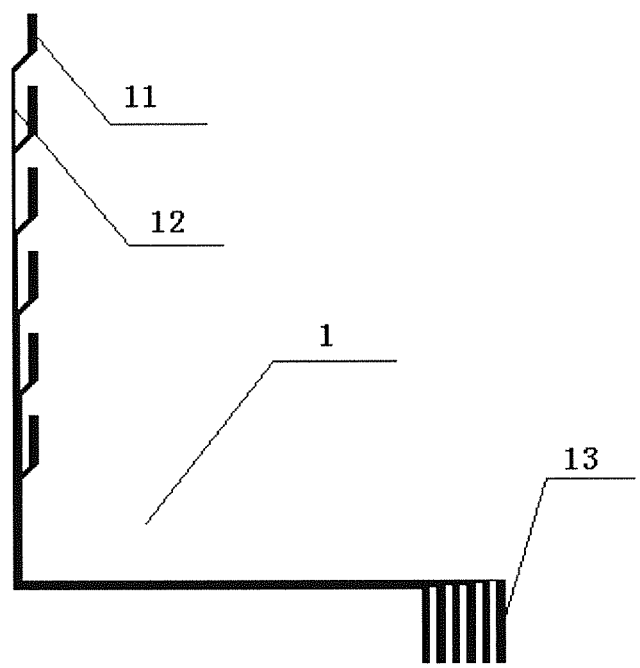
FIG. 1 is a schematic view of an embodiment of a lead electrode.
Figure 2:
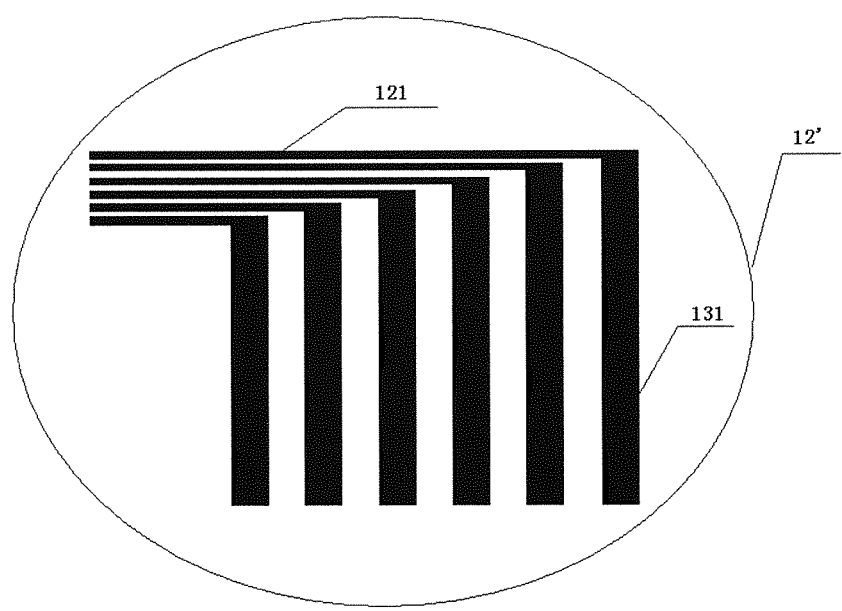
FIG. 2 is a partial, enlarged view of the lead electrode of FIG. 1.

Referring to FIG. 1, a first embodiment of a lead electrode 1 includes an inner terminal 11, a lead 12, and an outer terminal 13, which are sequentially connected. The inner terminal 11 and the outer terminal 13 are connected by the lead 12. FIG. 2 is a partial, enlarged view of a portion where the outer terminal 13 are connected to the lead 12 of FIG. 1, which is denoted as 12'. Referring to FIG. 2, in the illustrated embodiment, the number of the outer terminals 131 are six, each outer terminal 131 is connected to a lead 121, and six inner terminals 11 are connected to the six outer terminals 131 via six leads 121, respectively. Each lead 121 has a width of 10 μm to 200 μm.

Figure 3:
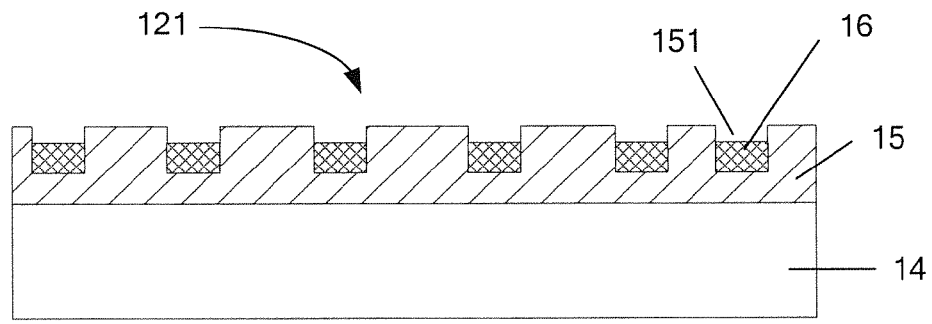
FIG. 3 is a cross-sectional view of a lead of a first embodiment.

Referring to FIG. 3, the lead 121 includes an insulating substrate 14 and an adhesive material 15 coated on the insulating substrate 14. The insulating substrate 14 can be made of PET. The adhesive material 15 can be made of UV acrylic adhesive. The adhesive material 15 defines a trenched mesh 151. The lead 121 further includes a conductive material 16 filled in the trenched mesh 151. The conductive material may be silver or copper.

Figure 4:
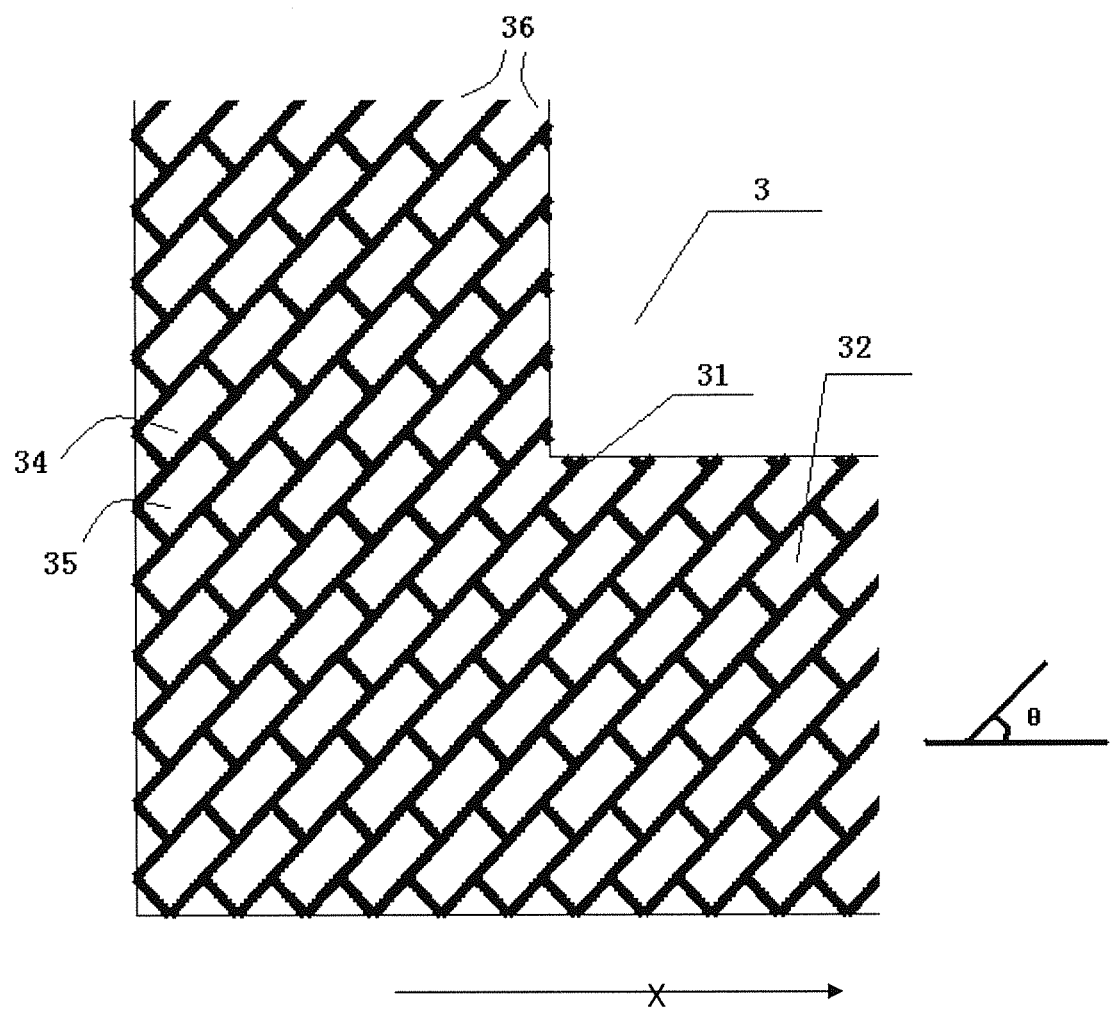
FIG. 4 is a schematic view of the lead according to the first embodiment.

FIG. 4 is a schematic view of the lead according to a first embodiment, which can be regarded as a partial, enlarged view of the corner of the lead 121 of FIG. 1.

As shown in FIG. 4, the lead 3 includes grid lines 31 formed by a trenched mesh and a blank area 32 located within the grid lines 31. The trenched mesh is formed by closely arranging a plurality of rectangular mesh cells of the same size, each rectangular mesh cell has an area of 240 $\mu m^2$ to $10^4$ $\mu m^2$. As shown in FIG. 4, an angle formed by the grid line 31 and a horizontal X-axis direction (i.e. demolding direction) is 45°, in alternative embodiment, the angle may be any angle from 0° to 90°.

Figure 5:
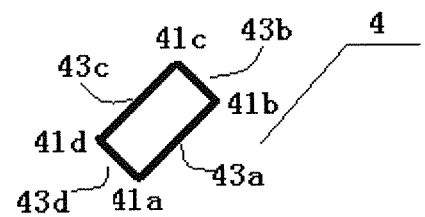
FIG. 5 is a schematic view of a mesh cell of the lead of FIG. 4.

Referring to FIG. 5, the mesh cell 4 is a rectangular mesh. The mesh cell 4 has vertexes 41a, 41b, 41c, 41d, and grid lines 43a, 43b, 43c, and 43d. The mesh cell 4 uses vertex 41a as a starting point, the grid line 43a extends from the vertex 41a to the vertex 41b; the grid line 43b extends from the vertex 41b to the vertex 41c; the grid line 43c extends from the vertex 41c to the vertex 41d; the grid line 43d extends from the vertex 41d to the vertex 41a, thus the mesh cell 4 is formed. In addition, a short side of the mesh cell is used as a short side of a mesh cell to be repeated to form the next mesh cell accordingly, and the mesh array 34 shown in FIG. 4 is obtained. A random point of the grid line 43a between the two vertexes of a long side of the mesh cell is selected as a vertex of a next mesh cell to form the next mesh cell according to the steps described above, the next mesh cell shares a longer side with the grid line 43a of the mesh cell 4, and the mesh array 35 shown in FIG. 4 is obtained. The mesh array 34 and the mesh array 35 cooperatively form the mesh sequence 36.

Figure 11:
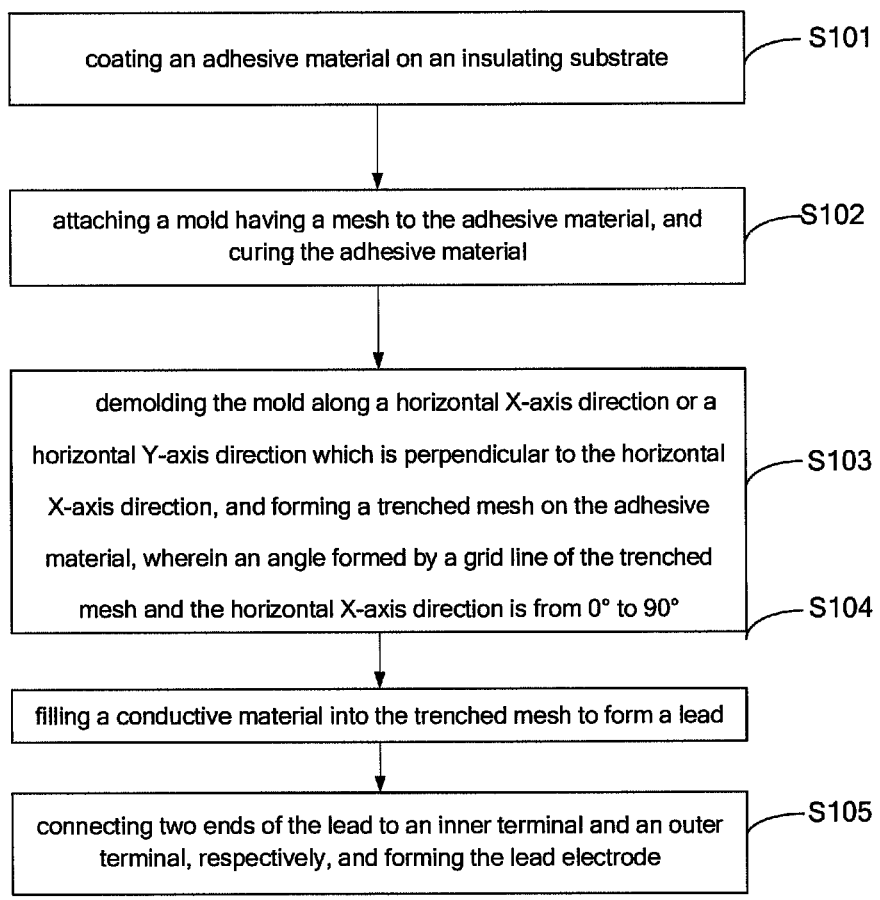
FIG. 11 is a flow chart of an embodiment of a method of preparing the lead electrode.

Referring to FIG. 11, an embodiment of a preparing method of the lead electrode described above includes the following steps:

Step S101, an adhesive material is coated on an insulating substrate.

The insulating substrate can be made of PET. The adhesive material can be made of UV acrylic adhesive.

Step S102, a mold having a mesh is attached to the adhesive material, and the adhesive material is cured.

The mold can be a thin nickel (Ni) foil. The mold is provided with a pattern corresponding to the trenched mesh. After curing the adhesive material, the pattern is embedded in the adhesive material.

Step S103, the mold is demolded along a horizontal X-axis direction or a horizontal Y-axis direction which is perpendicular to the horizontal X-axis direction, and a trenched mesh is formed on the adhesive material. An angle formed by a grid line of the trenched mesh and the horizontal X-axis direction is from 0° to 90°.

Figure 6:
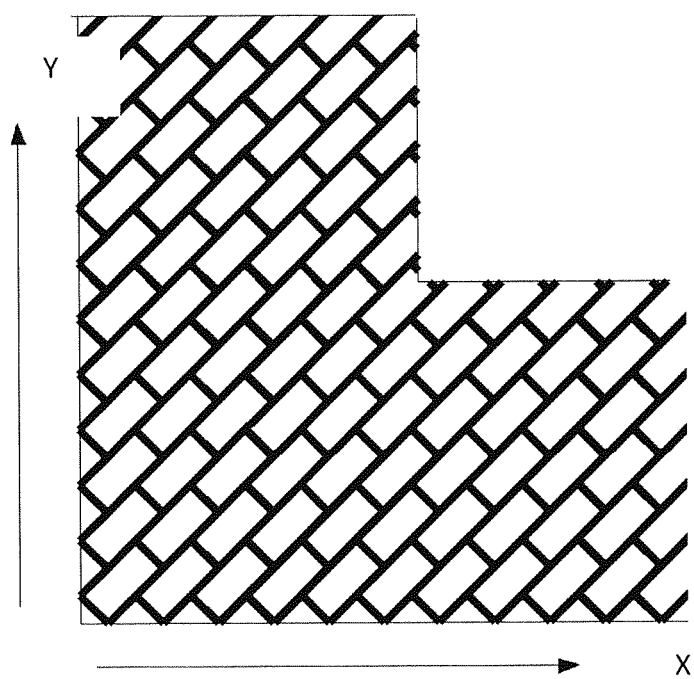
FIG. 6 is a schematic view showing a demolding direction of the lead of FIG. 4.

Referring to FIG. 6, the process of demolding is to tear the mold from an edge of the mold along the X-axis direction or the Y-axis direction shown in FIG. 6. Since the angle formed by the grid line and the horizontal X-axis direction is very small, and the adhesive in the angle is relatively small, only a few adhesive material particles (less than two points) will be attached to the mold and removed with the mold.

Step S104, a conductive material is filled into the trenched mesh to form a lead.

The conductive material may be silver or copper.

Step S105, two ends of the lead are connected to an inner terminal and an outer terminal, respectively, and the lead electrode is formed.

The resistance of the lead electrode ranges from 800 Ω to 1050 Ω.

Figure 7:
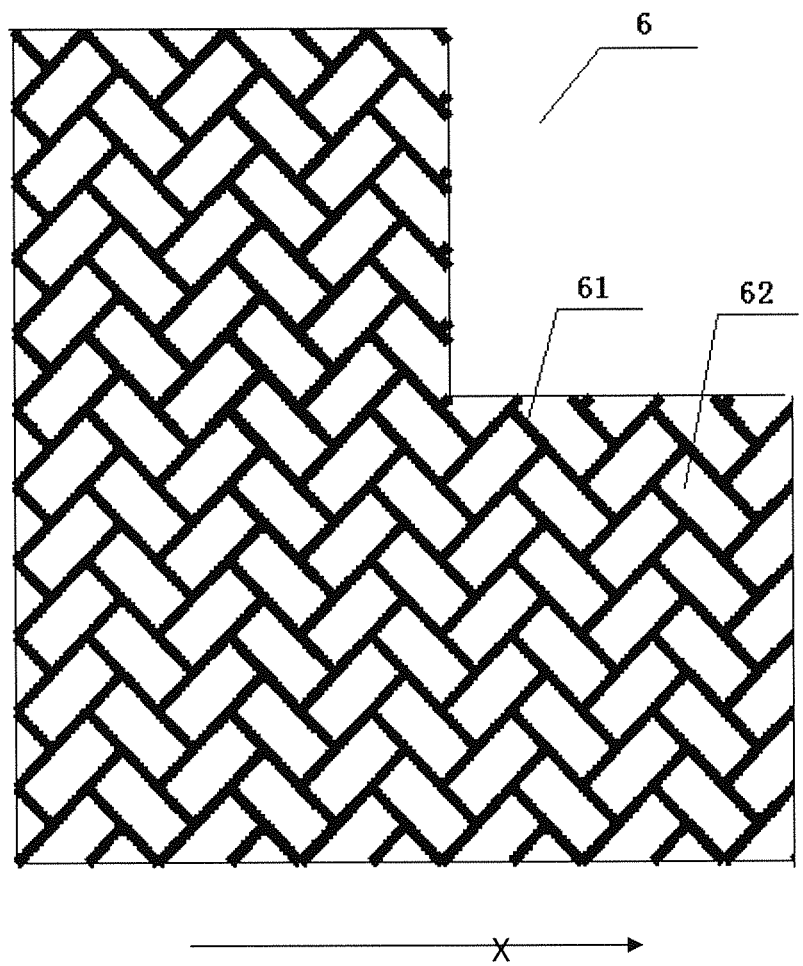
FIG. 7 is a schematic view of the lead according to a second embodiment.

FIG. 7 is a schematic view of the lead according to the second embodiment. The lead 6 includes grid lines 61 formed by a trenched mesh and a blank area 62 located within the grid lines 61. The trenched mesh is formed by closely arranging a plurality of rectangular mesh cells with the same size, while each two long sides of two adjacent rectangular mesh cells are perpendicular to each other, and the length of the short side is half of that of the long side, thus a braided mesh is formed. An angle formed by grid line 61 and the horizontal X-axis direction is 45°, in alternative embodiments, it can also be any angle from 0° to 90°.

Figure 7A:
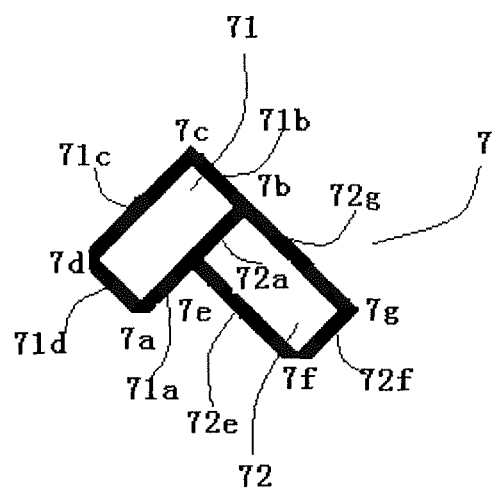
FIG. 7A is a schematic view of a mesh cell of the lead of FIG. 7.
Figure 7B:
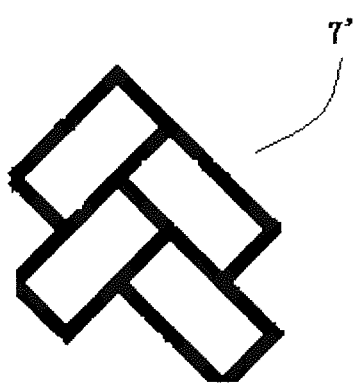
FIG. 7B is a schematic overlay view of a mesh cell of the lead of FIG. 7.

Referring to FIG. 7A, a mesh cell 7 of the braided mesh is shown which uses vertex 7a as a starting point, the braided wire 71a extends from the vertex 7a to the vertex 7b; the braided wire 71b extends from the vertex 7b to the vertex 7c; the braided wire 71c extends from the vertex 7c to the vertex 7d; and the braided wire 71d extends from the vertex 7d to the vertex 7a, thus forming the rectangular mesh 71. A middle point 7e of the braided wire 71a is selected as a starting point, the braided wire 72a extends from the vertex 7e to the vertex 7f; the braided wire 72f extends from the vertex 7f to the vertex 7g; the braided wire 72g extends from the vertex 7g to the vertex 7b; and the braided wire 71a extends from the vertex 7b to the vertex 7e, thus forming the rectangular mesh 72. The rectangular mesh 71 is perpendicular to the rectangular mesh 72, and a length of the braided wire 72a is half of that of the braided wire 71a, and they coincide. One vertex of the rectangular mesh 72 is located on the braided wire 71a, and the rectangular mesh 72 shares one vertex 7b with rectangular mesh 71. The length of the braided wire 71a is twice of that of the braided wire 71b, and the sizes of the rectangular mesh 71 and the rectangular mesh 71 are the same. FIG. 7B shows an overlaid mesh cell 7', which is formed by overlaying braided mesh cell 7 in a vertical direction. A braided mesh as shown in FIG. 7 is obtained by overlaying in both vertical and horizontal directions.

The preparation method of the second embodiment of the lead is similar to that of the first embodiment, which will not be described in further detail. It is shown in experiments that, when the electrode lead 6 is demolded along the horizontal X-axis direction, only a few adhesive particles (less than four points) will be attached to the mold, and less than 5 particles is attached to the mold along the horizontal Y-axis direction. In addition, the electrode lead has a better conductivity with a resistance ranged from 430 Ω to 1110 Ω.

Figure 8:
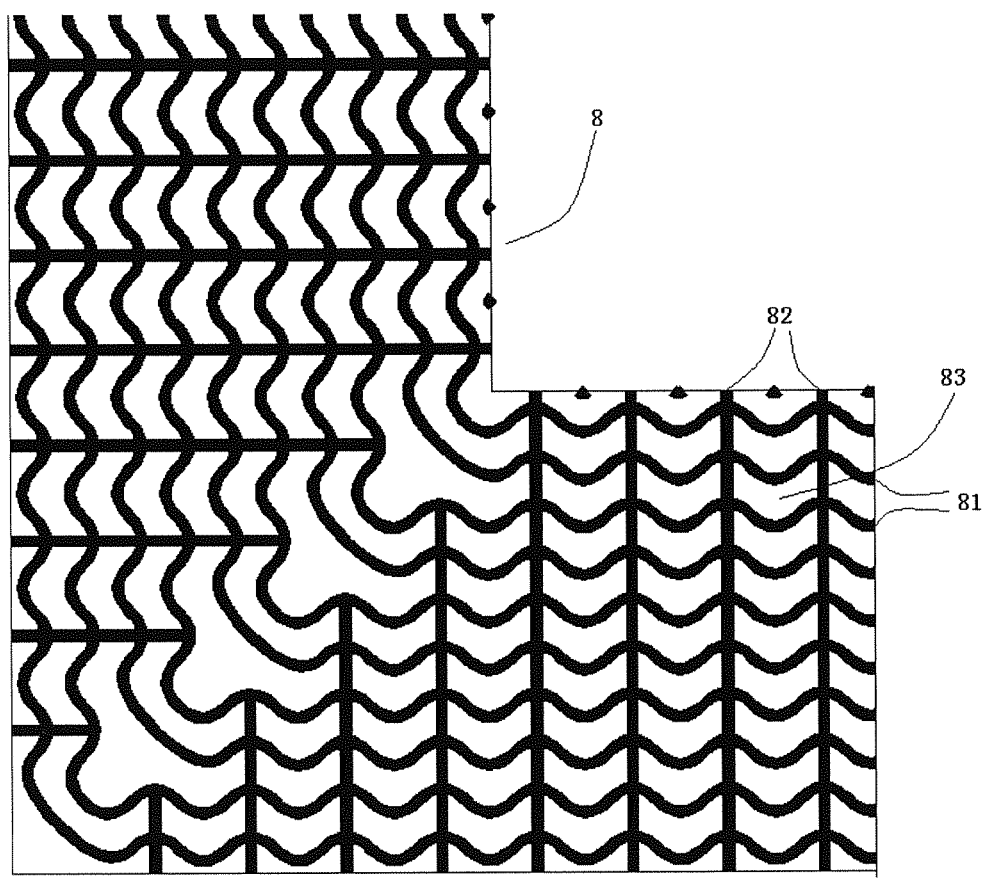
FIG. 8 is a schematic view of the lead according to a third embodiment.
Figure 8A:
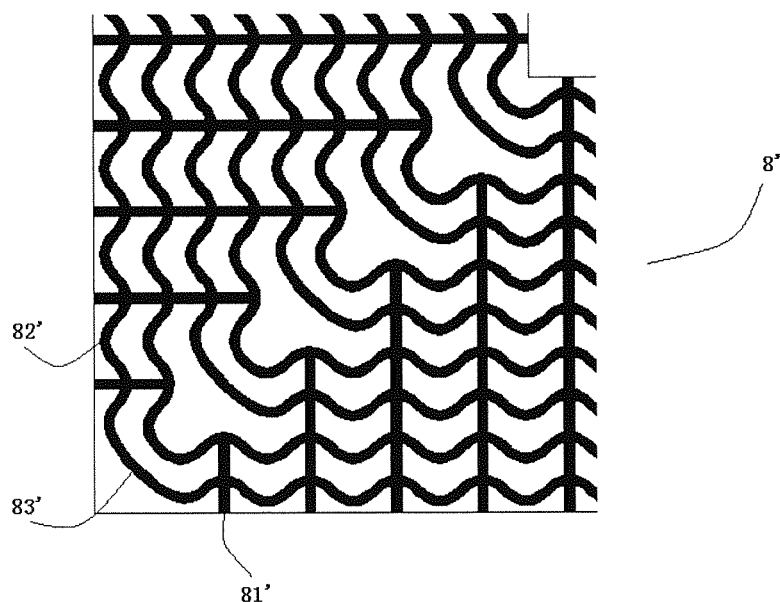
FIG. 8A is a schematic view of the mesh of the lead of FIG. 8 in the corner.

FIG. 8 is a schematic view of the lead according to the third embodiment. The lead 8 includes a plurality of quadrilateral mesh cells 83 formed by crossing of a plurality of wavy lines 81 and a plurality of straight lines 82. The quadrilateral mesh cell 83 is formed by two straight lines 82 and two wavy lines 81 connecting two ends of the two straight lines 82. The wavy line 81 and line 82 are c in FIG. 8, which is schematic. The orthogonalization of the wavy line 81 and line 82 is one type of intersection, which is not limited, while the orthogonal intersection is most preferable. The wave line 81 of the lead electrode 8 along a horizontal direction is horizontal, and the straight line 82 is vertical; the wave line 81 of the lead electrode 8 along a vertital direction is vertical, and the straight line 82 is horizontal. FIG. 8A is a schematic view of the mesh of the lead electrode 8' in the corner. The wave line 82' along a horizontal direction is connected to the wave line 82' along a vertical direction via a wave line 83', the straight line 81' is orthogonally intersected with the wave line 82', i.e., the wave lines around the corner are connected by a curve and can not be guaranteed to be orthogonal intersected with the straight 81', such that the straight line 81' is orthogonal intersected with part of wave line 82'. Wavy lines and horizontal grid at the intersection of the X-axis direction forms a tangent angle ranging from 0° to 90°, preferably 0° to 45°.

FIG. 9 shows a demolding direction of the horizontal X-axis and horizontal Y-axis direction for the lead. The lead electrode 8 is demolded along the horizontal X-axis direction, and lead electrode mold appears rarely adhesive particles, normally not adhesive particles at all. The lead electrode has a good conductive performance with a resistance ranging from 340 Ω to 1000 Ω.

It is to be understood that the trenched mesh can also be formed by closely arranging a plurality of hexagonal (shown in FIG. 10A) or flat hexagonal mesh cells (shown in FIG. 10B) with the same size.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A lead electrode, comprising an inner terminal, a lead, and an outer terminal, which are sequentially connected, the lead comprising:
   an insulating substrate;
   an adhesive material coated on the insulating substrate, the adhesive material defines a trenched mesh; and
   a conductive material filled in the trenched mesh, wherein an angle formed by a grid line of the trenched mesh and a demolding direction is from 0° to 90°.

2. The lead electrode according to claim 1, wherein the angle formed by the grid line of the trenched mesh and the demolding direction is 45°.

3. The lead electrode according to claim 1, wherein the trenched mesh is formed by closely arranging a plurality of rectangular mesh cells with the same size.

4. The lead electrode according to claim 3, wherein two long sides of two adjacent rectangular mesh cells are perpendicular to each other.

5. The lead electrode according to claim 3, wherein each rectangular mesh cell comprises two long sides and two short sides which are sequentially connected, and the length of the short side is half of the length of the long side.

6. The lead electrode according to claim 1, wherein the trenched mesh is formed by closely arranging a plurality of quadrilateral mesh cells, each quadrilateral mesh cell comprises two straight lines and two wavy lines connecting two ends of the two straight lines.

7. The lead electrode according to claim 1, wherein the trenched mesh is formed by closely arranging a plurality of hexagonal or flat hexagonal mesh cells with the same size.

8. The lead electrode according to claim 1, wherein the inner terminal and the outer terminal are trenched meshes.

* * * * *